(12) United States Patent
Tan

(10) Patent No.: US 10,017,848 B2
(45) Date of Patent: Jul. 10, 2018

(54) CRUCIBLE

(71) Applicant: AU OPTRONICS CORPORATION, Hsin-chu (TW)

(72) Inventor: Kelvin Yen-Kuang Tan, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/491,208

(22) Filed: Apr. 19, 2017

(65) Prior Publication Data

US 2018/0100230 A1   Apr. 12, 2018

(30) Foreign Application Priority Data

Oct. 11, 2016   (SG) .......................... 10201608496U

(51) Int. Cl.
*B01D 1/00*      (2006.01)
*C02F 1/04*      (2006.01)
*C23C 14/24*     (2006.01)

(52) U.S. Cl.
CPC ................... *C23C 14/243* (2013.01)

(58) Field of Classification Search
CPC ... F27B 14/00; C03B 5/10; C03B 5/06; C03B 5/02; B01D 1/06; B01D 1/08; B01D 1/00; C02F 1/08; C02F 1/04; C23C 14/243; C23C 14/24
See application file for complete search history.

(56) References Cited

U.S. PATENT DOCUMENTS

| | | | | |
|---|---|---|---|---|
| 3,572,672 A | * | 3/1971 | Harel | C23C 14/243 |
| | | | | 118/726 |
| 8,461,487 B2 | * | 6/2013 | Hoshino | C01B 33/037 |
| | | | | 219/383 |
| 2006/0121404 A1 | * | 6/2006 | Alipour | F27B 5/16 |
| | | | | 432/156 |
| 2007/0178225 A1 | * | 8/2007 | Takanosu | C23C 14/243 |
| | | | | 427/69 |
| 2008/0160472 A1 | * | 7/2008 | Chang | F27B 14/04 |
| | | | | 432/13 |
| 2009/0130619 A1 | * | 5/2009 | Okada | F27B 14/0806 |
| | | | | 432/158 |
| 2014/0026815 A1 | * | 1/2014 | Mathiasson | C23C 8/10 |
| | | | | 118/726 |
| 2016/0260934 A1 | | 9/2016 | Liu | |

FOREIGN PATENT DOCUMENTS

| | | | | |
|---|---|---|---|---|
| JP | 01306555 A | * | 12/1989 | ........... C23C 14/243 |
| KR | 101197271 B1 | * | 11/2012 | |
| WO | 2006041239 A1 | | 4/2006 | |

* cited by examiner

*Primary Examiner* — Gregory A Wilson
(74) *Attorney, Agent, or Firm* — Tim Tingkang Xia, Esq.; Locke Lord LLP

(57) ABSTRACT

A crucible includes a tank and an inner cover. The tank has a cavity. The inner cover is disposed in the cavity of the tank and has a first bottom surface and at least one hole. The first bottom surface faces a bottom of the tank and protrudes toward the bottom of the tank. A vertical distance between the bottom of the tank and the first bottom surface of the inner cover is gradually decreased from an edge toward a center of the first bottom surface.

9 Claims, 3 Drawing Sheets

CRUCIBLE

CROSS-REFERENCE TO RELATED PATENT APPLICATION

This application claims the benefit of priority to Singapore Patent Application No. 10201608496U, filed Oct. 11, 2016. The entire content of the above identified application is incorporated herein by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present disclosure relates to a crucible.

BACKGROUND

Thin films are deposited onto substrates for a variety of applications. For example, thin films are used in electronic and optical devices. The thin film may be single-layered structure or a multi-layered structure, and material of the thin film may be metal, semiconductor, or insulator. In the deposition processes, evaporation is a common method of thin-film deposition.

Evaporation device includes a chamber, a crucible and a carrier positioned in the chamber, in which the crucible is employed to contain evaporation materials. The carrier is employed to support workpieces and keep the workpieces toward the crucible. The evaporation material is placed in the crucible that is inserted into the chamber, and the electron beams are directed into the crucible. However, during the heating process, it is difficult to monitor the status of the evaporation material, and therefore, the yield rate of the evaporation process is difficult to be controlled as well.

SUMMARY

One aspect of the present disclosure is to provide a crucible. In certain embodiments, the crucible including a tank, an inner cover, and an outer cover. The inner cover includes a first bottom surface and a top surface, and the outer cover includes a second bottom surface. During an evaporation process, with the first bottom surface, the top surface, and the second bottom surface, an evaporation material in the liquid phase remaining on the inner cover and the outer cover can flow due to gravity and then drop back to the bottom of the tank. Therefore, the accumulation of the evaporation material is reduced, such that defective particles in an evaporation target formed by the evaporation material is reduced, thereby increasing the yield rate of the evaporation target in the evaporation process.

Another aspect of the present disclosure is to provide a crucible. In certain embodiments, the crucible includes a tank and an inner cover. The tank has a cavity. The inner cover is disposed in the cavity of the tank and has a first bottom surface and at least one hole. The first bottom surface faces the bottom of the tank and protrudes toward the bottom of the tank. A vertical distance between the bottom of the tank and the first bottom surface of the inner cover is gradually decreased from an edge toward a center of the first bottom surface.

In some embodiments, the crucible further includes an outer cover. The outer cover is disposed above the inner cover and has an opening therein.

In some embodiments, the outer cover further includes a second bottom surface facing the inner cover and slanted to a sidewall of the tank. A vertical distance between the bottom of the tank and the second bottom surface of the outer cover is gradually increased from an edge of the second bottom surface toward the opening.

In some embodiments, the second bottom surface of the outer cover is slanted at an angle $\theta$ relative to the sidewall of the tank, and $10° \leq \theta \leq 20°$.

In some embodiments, the inner cover has a plurality of the holes therein. The holes are arranged at the edge of the first bottom surface to surround an apex of the first bottom surface, and a vertical projection of the holes on the outer cover is out of the opening.

In some embodiments, the inner cover further includes a top surface facing and protruding toward the outer cover, and a vertical distance between the bottom of the tank and the top surface of the inner cover is gradually increased from an edge toward a center of the top surface.

In some embodiments, a distance between the second bottom surface of the outer cover and the top surface of the inner cover is d, and $0.3 \text{ cm} \leq d \leq 0.7 \text{ cm}$.

In some embodiments, the first bottom surface of the inner cover is slanted at an angle $\theta$ relative to the sidewall of the tank, and $100° \leq \theta \leq 110°$.

In some embodiments, the first bottom surface and the top surface of the inner cover are vertically symmetrical to each other.

In some embodiments, the tank further includes a sidewall and a supporter. The sidewall surrounds the cavity. The supporter is disposed on the sidewall, in which the inner cover is supported by the supporter.

In some embodiments, at least one portion of the inner cover is a taper, in which the taper protrudes toward the bottom of the tank and has an apex.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1A:
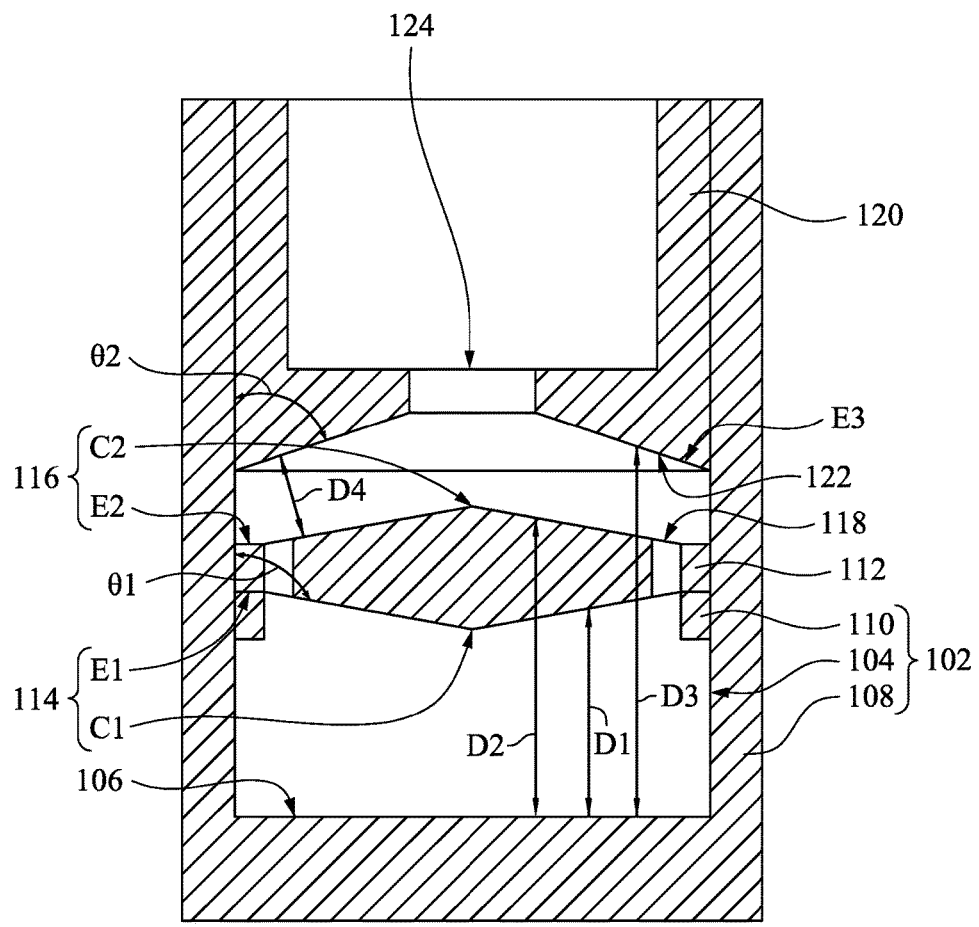
FIG. 1A is a cross-sectional view of a crucible according to some embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It will be understood that, although the terms first, second, third etc. may be used herein to describe various elements, components, regions, layers and/or sections, these elements, components, regions, layers and/or sections should not be limited by these terms.

As the yield rate of the evaporation process is difficult to be controlled, an aspect of the present disclosure is to provide a crucible including a tank, an inner cover, and an outer cover. The inner cover includes a first bottom surface and a top surface, and the outer cover includes a second bottom surface. During an evaporation process, with the first bottom surface, the top surface, and the second bottom surface, accumulation of an evaporation material on the inner cover and the outer cover is reduced, such that the yield rate of a target in the evaporation process is increased.

Figure 1B:
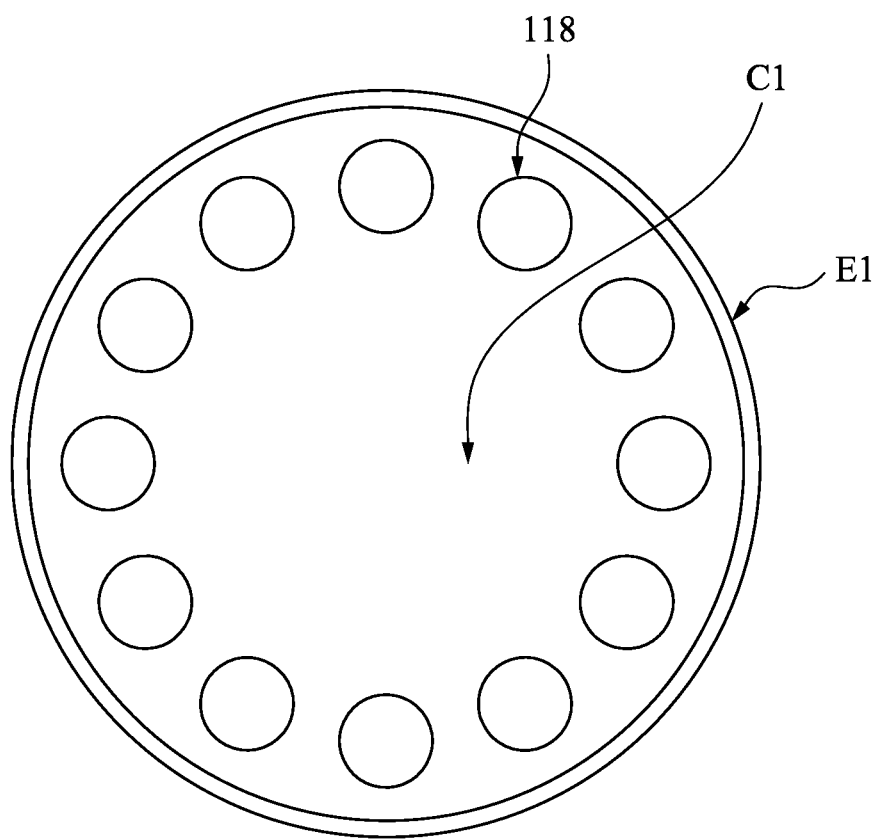
FIG. 1B is a top view of an inner cover of the crucible illustrated in FIG. 1A.

FIG. 1A is a cross-sectional view of a crucible 100 according to some embodiments of the present disclosure, and FIG. 1B is a top view of an inner cover 112 of the crucible 100 illustrated in FIG. 1A. As shown in FIGS. 1A and 1B, the crucible 100 includes a tank 102, the inner cover 112, and an outer cover 120. The tank 102 includes a bottom 106, a sidewall 108, and a supporter 110. The sidewall 108 is disposed on and connected to the bottom 106, and the supporter 110 is disposed on and connected to the sidewall 108. In addition, the tank 102 has a cavity 104 therein, in which the cavity 104 can be defined by the bottom 106 and the sidewall 108. For example, the sidewall 108 surrounds the cavity 104. Furthermore, the cavity 104 near bottom 106 can be configured to contain at least one evaporation material (not illustrated). For example, silver can be contained in the cavity 104 near bottom 106 to serve as the evaporation material. The inner cover 112 and the outer cover 120 are disposed in the cavity 104 of the tank 102, in which the inner cover 112 is supported by the supporter 110. The outer cover 120 is disposed above the inner cover 112, and thus the inner cover 112 is disposed between the bottom 106 of the tank 102 and the outer cover 120. In other words, the outer cover 120 overlies the inner cover 112, and the bottom of the tank 102 underlies the inner cover 112.

The inner cover 112 has a first bottom surface 114, a top surface 116, and a plurality of holes 118 therein, in which the first bottom surface 114 and the top surface 116 are opposite to each other.

The first bottom surface 114 faces and protrudes toward the bottom 106 of the tank 102. The first bottom surface 114 has a center C1 and an edge E1, in which a vertical distance D1 between the bottom 106 of the tank 102 and the first bottom surface 114 of the inner cover 112 is gradually decreased from the edge E1 toward the center C1 of the first bottom surface 114. Accordingly, the first bottom surface 114 of the inner cover 112 may be slanted at an angle θ1 relative to the sidewall 108 of the tank 102, in which 100°≤θ1≤110°.

The top surface 116 faces and protrudes toward the outer cover 120. The top surface 116 has a center C2 and an edge E2, in which vertical distance D2 between the bottom 106 of the tank 102 and the top surface 116 of the inner cover 112 is gradually increased from the edge E2 toward the center C2 of the top surface 116.

Therefore, at least one portion of the inner cover 112 may be a taper. For example, the taper may protrude toward the bottom 106 of the tank 102 and has an apex, in which the apex of the taper can be located at the center C1 of the first bottom surface 114. Furthermore, in some embodiments, the first bottom surface 114 and the top surface 116 of the inner cover 112 are vertically symmetrical to each other. In other words, the first bottom surface 114 and the top surface 116 are symmetrical about a central horizontal plane of the inner cover 112.

The holes 118 go through inner cover 112. In other words, the holes 118 are penetrating through the first bottom surface 114 and the top surface 116. In addition, the holes 118 are arranged at the edge E1 of the first bottom surface 114 to surround an apex of the first bottom surface 114, in which the apex of the first bottom surface 114 is located at the same position as the center C1 thereof.

The outer cover 120 has a second bottom surface 122 and an opening 124 therein. The second bottom surface 122 faces the top surface 116 of the inner cover 112 and slanted to the sidewall 108 of the tank 102. The second bottom surface 122 has an edge E3, and the opening 124 is located at a center of the second bottom surface 122. A vertical distance D3 between the bottom 106 of the tank 102 and the second bottom surface 122 of the outer cover 120 is gradually increased from the edge E3 of the second bottom surface 122 toward the opening 124. Accordingly, the second bottom surface 122 of the outer cover 120 may be slanted at an angle θ2 relative to the sidewall 108 of the tank 102, in which 10°≤θ2≤20°. Thus, the second bottom surface 122 facing the top surface 116 of the inner cover 112 can be referred to as a concave surface.

In addition, a vertical projection of the holes 118 on the outer cover 120 is out of the opening 124, and space between the inner cover 112 and the outer cover 120 can be referred to as at least one channel. The evaporation material in a gaseous phase may flow from the bottom 106 to the top of the tank 102 through the channel. In other words, the evaporation material at the bottom 106 of the tank 102 can be heated to evaporate, and the evaporated material in the gaseous phase can flow from the bottom 106 to the top of the tank 102 through the holes 118, the channel, and the opening 124 in sequence. Moreover, the dimension of the channel can be defined by a distance D4 between the second bottom surface 122 of the outer cover 120 and the top surface 116 of the inner cover, in which 0.3 cm≤D4≤0.7 cm.

Under the configuration above, during an evaporation process for forming a layer on a target, the evaporation material on the inner cover 112 or the outer cover 120 can drop back to the bottom 106 of the tank 102, thereby preventing a defective particle from forming on the target. Moreover, in some embodiments, the evaporation process may be performed for forming an evaporated silver on an organic light-emitting diode (OLED) structure to serve as an electrode for the OLED structure. The details of preventing the defective particle from forming on the target are exemplarily provided as below.

Figure 2:
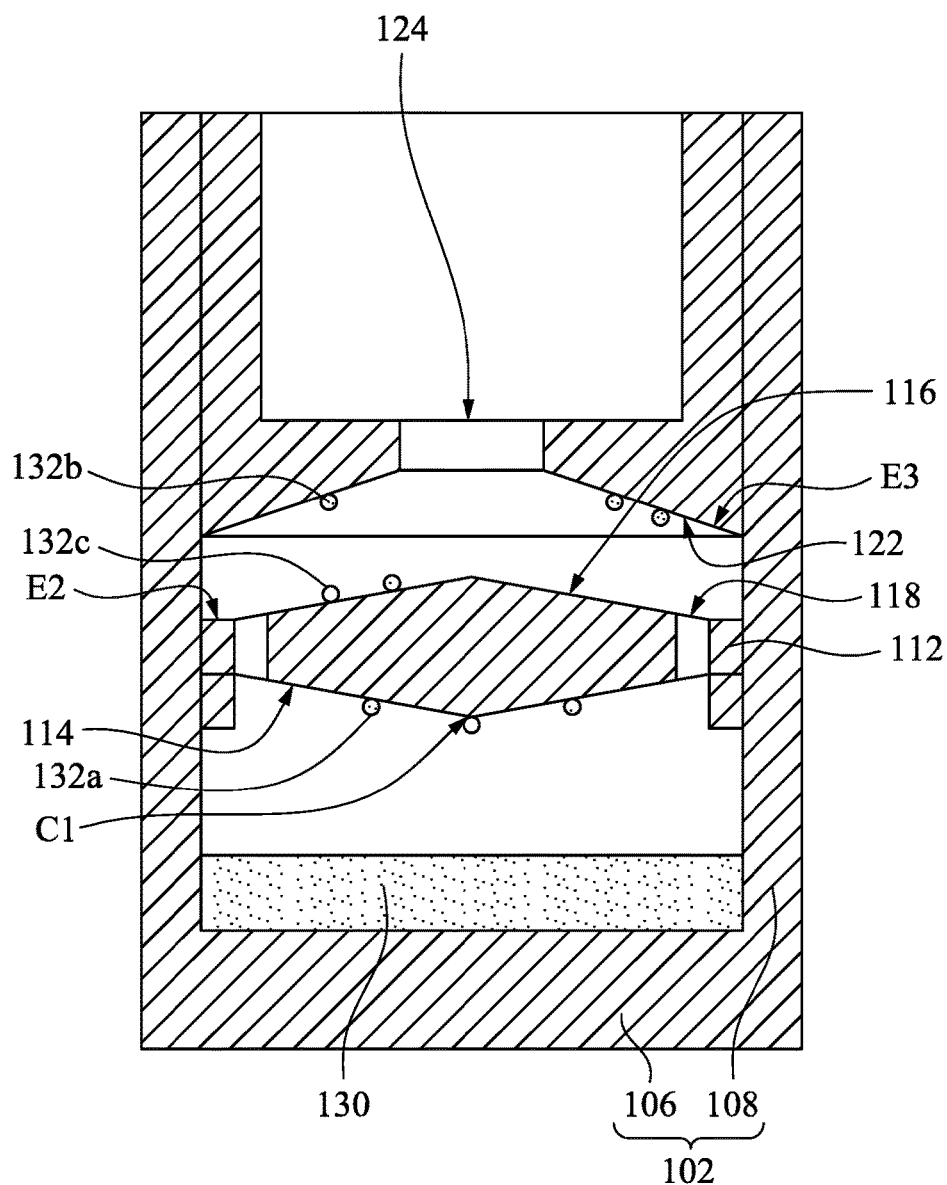
FIG. 2 is a cross-sectional view of the crucible illustrated in FIG. 1A during an evaporation process.

FIG. 2 is a cross-sectional view of the crucible 100 illustrated in FIG. 1A during an evaporation process. As shown in FIG. 2, an evaporation material 130 is disposed on the bottom 106 of the tank 102, in which the evaporation material 130 may be silver in accordance with some embodiments. During the evaporation process, a portion of the evaporation material 130 can be evaporated; that is, the portion of the evaporation material 130 is heated into the gaseous phase. The evaporated portion of the evaporation material 130 escapes from other non-evaporated portions of evaporation material 130 remaining on the bottom 106 of the tank 102, so that the evaporated portion of the evaporation material 130 can flow upwardly. Then, when the evaporated portion of the evaporation material 130 reaches the inner cover 112, one group of the evaporated portion of the evaporation material 130 may pass through the inner cover 112 through the holes 118, and another group of the evaporated portion of the evaporation material 130 may be blocked by the first bottom surface 114 of the inner cover 112 and remain on it. The group remaining on the first bottom surface 114 may condense into the liquid phase, as liquid drops 132a. Since the first bottom surface 114 protrudes toward the bottom 106 of the tank 102, the liquid drops 132a remaining on the first bottom surface 114 can flow to the center C1 of the first bottom surface 114 due to gravity. Next, once the liquid drops 132a mass at the center C1 of the first bottom surface 114, the liquid drops 132a may drop from the first bottom surface 114 toward the bottom 106 of the tank 102.

Therefore, the evaporation material 130 which does not pass through the inner cover 112 through the holes 118 can drop back to the bottom 106 of the tank 102 and be collected back to the bottom 106 of the tank 102. It is understood that once the evaporation material 130 accumulates on the first bottom surface 114 and becomes solid particles thereon, the solid particles may rise with the upward airflow and then adhere to the target to become the defective particles in the target, in which the yield rate of the target in the evaporation process may be reduced by the existence of the defective particle. Since the evaporation material 130 on the first bottom surface 114 can drop back to the bottom 106 of the tank 102, such aforementioned defective particles can be reduced, so that the yield rate can be improved.

In the other hand, after the evaporation material 130 passes through the inner cover 112 through the holes 118 from the bottom 106 of the tank 102, one group of the evaporation material 130 may pass through the outer cover 120 through the opening 124 and reach the target, and another group of the evaporation material 130 may be blocked by the second bottom surface 122. Wherein the target is disposed on the crucible 100, for example, the target is a substrate facing the opening 124. The blocked group of the evaporation material 130 may remain on the second bottom surface 122 of the outer cover 120 and condense into the liquid phase, as liquid drops 132b. Since the second bottom surface 122 facing the top surface 116 of the inner cover 112 is concave and is slanted to the sidewall 108 of the tank 102, some of the liquid drops 132b remaining on the second bottom surface 122 can flow toward the edge E3 of the second bottom surface 122 due to gravity and then drop from the second bottom surface 122 toward the bottom 106 of the tank 102 through the holes 118. Alternatively, some of the liquid drops 132b remaining on the second bottom surface 122 may drop from the second bottom surface 122 to the top surface 116 of the inner cover 112, as liquid drops 132c. Since the top surface 116 protrudes toward the outer cover 120, the liquid drops 132c remaining on the top surface 116 of the inner cover 112 may flow toward the edge E2 of the top surface 116 due to gravity and then drop from the top surface 116 toward the bottom 106 of the tank 102 through the holes 118. Accordingly, with the first bottom surface 114, the top surface 116, and the second bottom surface 122, the evaporation material 130 remaining thereon can be collected back to the bottom 106 of the tank 102, and therefore accumulation of the evaporation material 130 on these surfaces is reduced.

In aforementioned embodiments, the crucible of the present disclosure includes the tank, the inner cover, and the outer cover. The inner cover includes the first bottom surface and the top surface, and the outer cover includes the second bottom surface. During the evaporation process, with the first bottom surface, the top surface, and the second bottom surface, the evaporation material in the liquid phase remaining on the inner cover and the outer cover can flow due to gravity and then drop back to the bottom of the tank. Therefore, the accumulation of the evaporation material is reduced, such that the defective particles in the target formed by the evaporation material is reduced, thereby increasing the yield rate of the target in the evaporation process.

Although the present disclosure has been described in considerable details with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of the present disclosure provided they fall within the scope of the following claims.

What is claimed is:

1. A crucible, comprising:
a tank having a cavity; and
an inner cover disposed in the cavity of the tank and having a first bottom surface and at least one hole, wherein the first bottom surface faces a bottom of the tank and protrudes toward the bottom of the tank, and a vertical distance between the bottom of the tank and the first bottom surface of the inner cover is gradually decreased from an edge of the first bottom surface toward a center of the first bottom surface; and
an outer cover disposed above the inner cover and having an opening therein, wherein the outer cover further comprises a second bottom surface facing the inner cover and slanted to a sidewall of the tank, and a vertical distance between the bottom of the tank and the second bottom surface of the outer cover is gradually increased from an edge of the second bottom surface toward the opening.

2. The crucible of claim 1, wherein the second bottom surface of the outer cover is slanted at an angle θ relative to the sidewall of the tank, and 10°≤θ≤20°.

3. The crucible of claim 1, wherein the inner cover has a plurality of holes therein, the holes are arranged at the edge of the first bottom surface to surround an apex of the first bottom surface, and a vertical projection of the holes on the outer cover is out of the opening.

4. The crucible of claim 1, wherein the inner cover further comprises a top surface facing and protruding toward the outer cover, and a vertical distance between the bottom of the tank and the top surface of the inner cover is gradually increased from an edge of the top surface toward a center of the top surface.

5. The crucible of claim 4, wherein a distance between the second bottom surface of the outer cover and the top surface of the inner cover is d, and 0.3 cm≤d≤0.7 cm.

6. The crucible of claim 4, wherein the first bottom surface of the inner cover is slanted at an angle θ relative to the sidewall of the tank, and 100°≤θ≤110°.

7. The crucible of claim 6, wherein the first bottom surface and the top surface of the inner cover are vertically symmetrical to each other.

8. The crucible of claim 1, wherein the tank further comprises:
a sidewall surrounding the cavity; and
a supporter disposed on the sidewall, wherein the inner cover is supported by the supporter.

9. The crucible of claim 1, wherein at least one portion of the inner cover is a taper protruding toward the bottom of the tank and having an apex.

* * * * *